(12) United States Patent
Li et al.

(10) Patent No.: US 10,742,016 B2
(45) Date of Patent: Aug. 11, 2020

(54) CIRCUIT INTERRUPTION APPARATUSES

(71) Applicant: General Electric Technology GmbH, Baden (CH)

(72) Inventors: Botong Li, Stafford (GB); Wentao Huang, Stafford (GB); Hengxu Ha, Stafford (GB); Sankara Subramanian Sri Gopala Krishna Murthi, Stafford (GB)

(73) Assignee: General Electric Technology GmbH, Baden (CH)

(*) Notice: Subject to any disclaimer, the term of this patent is extended or adjusted under 35 U.S.C. 154(b) by 271 days.

(21) Appl. No.: 15/539,213

(22) PCT Filed: Dec. 22, 2015

(86) PCT No.: PCT/EP2015/081033
§ 371 (c)(1),
(2) Date: Jun. 23, 2017

(87) PCT Pub. No.: WO2016/102593
PCT Pub. Date: Jun. 30, 2016

(65) Prior Publication Data
US 2017/0353026 A1    Dec. 7, 2017

(30) Foreign Application Priority Data

Dec. 23, 2014 (EP) .................................... 14275265

(51) Int. Cl.
*H02H 3/42* (2006.01)
*H02H 3/08* (2006.01)
(Continued)

(52) U.S. Cl.
CPC ......... *H02H 3/08* (2013.01); *G01R 19/16571* (2013.01); *G05B 19/058* (2013.01);
(Continued)

(58) Field of Classification Search
CPC .. H02H 3/08; H02H 3/382; H02H 3/42; H02J 3/12; H02J 3/00; H02J 2003/007; G05B 19/058; G01R 19/058
(Continued)

(56) References Cited

U.S. PATENT DOCUMENTS 5,883,796 A * 3/1999 Cheng ................... H02J 3/1814
307/105
2009/0292488 A1* 11/2009 Ingham ..................... H02J 3/14
702/64
(Continued)

FOREIGN PATENT DOCUMENTS

CN         102077433 A       5/2011
DE    10 2011 006 979 A1   10/2012
(Continued)

OTHER PUBLICATIONS

Extended European Search Report and Opinion issued in connection with corresponding EP Application No. 14275265.8 dated Jun. 22, 2015.
(Continued)

*Primary Examiner* — Danny Nguyen
(74) *Attorney, Agent, or Firm* — Eversheds Sutherland (US) LLP

(57) ABSTRACT

A circuit interruption apparatus, for an electrical network, comprising a circuit interruption device that is operatively connectable at a source side to a source of the electrical network and at a back side to a load of an electrical network. The circuit interruption device when closed permits and when open inhibits the current flow between the source side the back side. The current interruption device is configured to open when a current flowing therethrough meets or exceeds a fault current threshold. The circuit interruption apparatus also includes a fault current level determination unit that is configured to determine a predicted fault current
(Continued)

level as a function of measured current and voltage values at the circuit interruption device before and after a variation in the current and voltage values at the circuit interruption device that result from a change of load at the back side of the circuit interruption device.

11 Claims, 2 Drawing Sheets

(51) Int. Cl.
*G01R 19/165* (2006.01)
*G05B 19/05* (2006.01)
*H02H 3/38* (2006.01)
*H02J 3/12* (2006.01)
*H02J 3/00* (2006.01)

(52) U.S. Cl.
CPC .............. *H02H 3/382* (2013.01); *H02H 3/42* (2013.01); *H02J 3/12* (2013.01); *H02J 3/00* (2013.01); *H02J 2203/20* (2020.01); *Y02E 60/76* (2013.01); *Y04S 40/22* (2013.01)

(58) Field of Classification Search
USPC .............................................. 361/42, 62–69
See application file for complete search history.

(56) References Cited

U.S. PATENT DOCUMENTS

| | | | | |
|---|---|---|---|---|
| 2010/0301872 | A1* | 12/2010 | Kereit ...................... | H02H 3/40 |
| | | | | 324/521 |
| 2013/0119972 | A1* | 5/2013 | Maguire .............. | G01R 35/005 |
| | | | | 324/74 |

FOREIGN PATENT DOCUMENTS

| | | |
|---|---|---|
| EP | 1 928 007 A1 | 6/2008 |
| JP | 2007-244134 A | 9/2007 |

OTHER PUBLICATIONS

International Search Report and Written Opinion issued in connection with corresponding PCT Application No. PCT/EP2015/081033 dated Apr. 14, 2016.

First Office Action and Search issued in connection with corresponding CN Application No. 201510083378.7 dated Dec. 27, 2017.

* cited by examiner

CIRCUIT INTERRUPTION APPARATUSES

FIELD OF INVENTION

The present invention relates to a circuit interruption apparatus for an electrical network.

BACKGROUND OF THE INVENTION

Electrical networks, such as distribution networks, can include distributed voltage sources, e.g. distributed generators, to produce sustainable power with low carbon emissions.

Conventional distribution networks are gradually being transformed into active distribution networks which have complex topologies that permit bi-directional power flow. Such active distribution networks also provide plug-and-play functionality for the distributed voltage sources and/or the or each load included therein.

While such plug-and-play functionality provides many potential benefits it also creates difficulties in terms of managing the safe operation of the resulting electrical network.

BRIEF DESCRIPTION OF THE INVENTION

According to an aspect of the invention there is provided a circuit interruption apparatus, for an electrical network, comprising: a circuit interruption device operatively connectable at a source side to a source of the electrical network and at a back side to a load of an electrical network, the circuit interruption device when closed permitting current to flow between the source side and the back side, and the circuit interruption device when open inhibiting current from flowing between the source side and the back side, wherein the circuit interruption device is configured to open when a current flowing therethrough meets or exceeds a fault current threshold; and a fault current level determination unit configured to determine a predicted fault current level as a function of measured current and voltage values at the circuit interruption device before and after a variation in the current and voltage values at the circuit interruption device resulting from a change of load at the back side of the circuit interruption device.

The inclusion of a fault current determination unit that is able to determine a predicted fault current level solely on the basis of measured current and voltage values of an associated circuit interruption device is, in an embodiment, advantageous when the circuit interruption device is located in, e.g. a distribution network to which one or more further distributed voltage sources may be added, since it allows the potential increase in fault current (due to the additional contribution to a possible fault current of the or each further distributed voltage source) to be taken into account when assessing whether the circuit interruption device remains capable of handling the possible fault current.

In this manner the circuit interruption apparatus of embodiments the invention is able to help ensure the continued safe operation of, e.g. a wider electrical network in which the distributed network is located.

Moreover, the fault current level determination unit is able to facilitate such assessment of the fault current handling capability of the circuit interruption device without needing to know the topology of the whole electrical network in which the distributed network is located.

In addition, such a fault current level determination unit allows mitigating steps, e.g. elsewhere in the wider electrical network, to be taken if it is considered the circuit interruption device will be unable to handle the possible fault current, i.e. the predicted fault current level determined by the fault current level determination unit, and so avoids the need to include fault current limiters in the electrical network to protect an otherwise overloaded circuit interruption device. The omission of fault current limiters is desirable because they adversely impact on the voltage within the network during its normal operation and thereby degrade the power quality of the or each load in the network. Their inclusion also increases the risk of a fault occurring (and hence a fault current arising) in the first place, and the additional cost of such equipment reduces the cost-efficiency of the network.

As well as the foregoing, the inclusion of such a fault current level determination unit, i.e. one which is able to determine a predicted fault current level, allows for a sensing of a very low predicted fault current level, e.g. such as may be occasioned by a disconnection of the back side of the associated circuit interruption device from the electrical network in which it is located. Such sensing can, in turn, be used to manage the operation of the or each source, i.e. voltage source, connected in use to the source side of the circuit interruption device, and thereby improve the operational safety of the or each such source.

In an embodiment, the fault current level determination unit is configured to determine each of an equivalent voltage source value of an electrical network on the back side of the circuit interruption device and an equivalent impedance value of the said electrical network on the back side of the circuit interruption device from the measured current and voltage values at the circuit interruption device, and to use the said equivalent voltage source value and the equivalent impedance value to determine the predicted fault current level.

The equivalent voltage source value of the electrical network on the back side and the equivalent impedance value of the electrical network on the back side can be determined in real time and so permit the predicted fault current level to be determined in real time too, thereby allowing for, e.g. a continuous assessment of whether the circuit interruption device remains capable of handling a possible fault current that might arise at any given moment.

Optionally the fault current level determination unit is configured to calculate a current phasor from the measured current value at the circuit interruption device and a voltage phasor from the measured voltage value at the circuit interruption device, and to use the calculated current and voltage phasors to determine the equivalent voltage source value and the equivalent impedance value.

The calculation of current and voltage phasors from, respectively, the measured current and voltage values at the circuit interruption device reduces the complexity associated with subsequently determining, e.g. by calculation, the equivalent voltage source value and the equivalent impedance value, and so makes such values much easier to determine computationally.

The fault current level determination unit may be configured to:

measure first current and voltage values at the circuit interruption device at a first time and thereafter calculate first current and voltage phasors; measure second current and voltage values at the circuit interruption device at a second time after the first time and thereafter calculate second current and voltage phasors; determine the equivalent impedance value according to:

$$Z_{eq} = \arg\frac{\dot{U}_1 - \dot{U}_2}{\dot{I}_1 - \dot{I}_2}$$

where $Z_{eq}$ is the determined equivalent impedance value; $\dot{U}_1$ is the first voltage phasor; $\dot{U}_2$ is the second voltage phasor; $\dot{I}_1$ is the first current phasor; and $\dot{I}_2$ is the second current phasor And determine the equivalent voltage source value according to:

$$E_{eq} = \sqrt{U_2^2 + (I_2 Z_{eq})^2 - 2U_2 I_2 Z_{eq}\cos(\theta_{U1} - \theta_{I1} + \theta_Z)}$$

where $E_{eq}$ is the determined equivalent voltage source value; $U_2$ is the magnitude of the second voltage phasor; $I_2$ is the magnitude of the second current phasor; $\theta_{U1}$ is the angle of the first voltage phasor; $\theta_{I1}$ is the angle of the first current phasor; and $\theta_Z$ is the angle of the determined equivalent impedance value.

Having a fault current level determination unit configured to determine each of the equivalent impedance value and the equivalent voltage source value in the foregoing manner permits such values to be readily determined in real time with a relatively low computational and associated processor overhead.

In an embodiment of the invention, prior to determining each of an equivalent voltage source value and an equivalent impedance value, the fault current level determination unit is additionally configured to assess the nature of any variation in the measured current value at the circuit interruption device.

Assessing the nature of any variation in the measured current value of the circuit interruption device allows the fault current determination unit to establish whether it is undesirable at any given instant to move on to determine each of the equivalent voltage source value and the equivalent impedance value (in order thereafter to determine the predicted fault current level), and thereby helps to reduce the occurrence of errors in the predicted fault current level such as may arise, e.g. when only small variations occur in the measured current value at the circuit interruption device.

Optionally the fault current level determination unit is configured to assess the nature of any variation in the measured current value of the circuit interruption device by detecting whether a predetermined degree of current variation takes place.

Having a fault current level determination unit so configured permits the triggering of subsequent operation of the fault current level determination unit only as desired so as to reduce the likelihood of large errors in the predicted fault current level, and helps to establish a first time at which first current and first voltage values at the circuit interruption device should be measured.

In an embodiment of the invention the fault current level determination unit is configured to assess the nature of any variation in the measured current value at the circuit interruption device by identifying whether the current variation takes place on the back side of the circuit interruption device.

The ability to identify whether the current variation takes place on the back side of the circuit interruption device helps to prevent subsequent operation of the fault current level determination unit when, e.g. the current variation takes place on the source side of the circuit interruption device, and so further helps to eliminate the introduction of large errors into the predicted fault current level.

In an embodiment, after determining each of an equivalent voltage source value and an equivalent impedance value, the fault current level determination unit is additionally configured to filter each of the determined equivalent voltage source value and the determined equivalent impedance value.

Such filtering of the determined equivalent voltage source and impedance values helps to reduce the impact of any errors in the said determined equivalent voltage source and impedance values on the subsequently determined predicted fault current level, and thereby improves the stability of the determined fault current level.

The fault current level determination unit may be configured to filter each of the determined equivalent voltage source value and the determined equivalent impedance value by calculating an average of each of the determined equivalent voltage source value and the determined equivalent impedance value over a predetermined number of iterations.

Calculating averages of the determined equivalent voltage source and the determined equivalent impedance values helps to reduce the impact of errors introduced into the magnitude and angle of current and voltage phasors, e.g. in instances where they are calculated by a Full-Cycle Fourier Transform, and the subsequent impact of these errors on the equivalent voltage source value and the equivalent impedance value determined from the said potentially erroneous current and voltage phasors.

Optionally the fault current level determination unit is configured to filter each of the determined equivalent voltage source value and the determined equivalent impedance value by comparing the fluctuation in each of the determined equivalent voltage source value and the determined equivalent impedance value with a predetermined threshold and discarding the or each of the corresponding determined equivalent voltage source value and the corresponding determined equivalent impedance value when the fluctuation is greater than the predetermined threshold.

Comparing the fluctuation in each of the determined equivalent voltage source value and the determined equivalent impedance value with a predetermined threshold also helps to reduce the impact of errors introduced into the magnitude and angle of current and voltage phasors and the subsequent impact of these errors on the equivalent voltage source value and the equivalent impedance value determined therefrom.

In an embodiment, the fault current level determination unit is further configured to compare the determined predicted fault current level with at least one setting threshold and to issue an alarm depending on the outcome of the comparison.

Such an arrangement desirably permits the circuit interruption apparatus of an embodiment the invention to issue an alarm, e.g. if the circuit interruption device included therein is incapable of handling the predicted fault current level (as determined at any particular instant), or if the back side of the circuit interruption device included therein has become disconnected from an associated electrical network.

BRIEF DESCRIPTION OF THE DRAWINGS

There now follows a brief description of embodiments of the invention, by way of non-limiting example, with reference being made to the following figures in which.

DETAILED DESCRIPTION OF THE INVENTION

Figure 1:
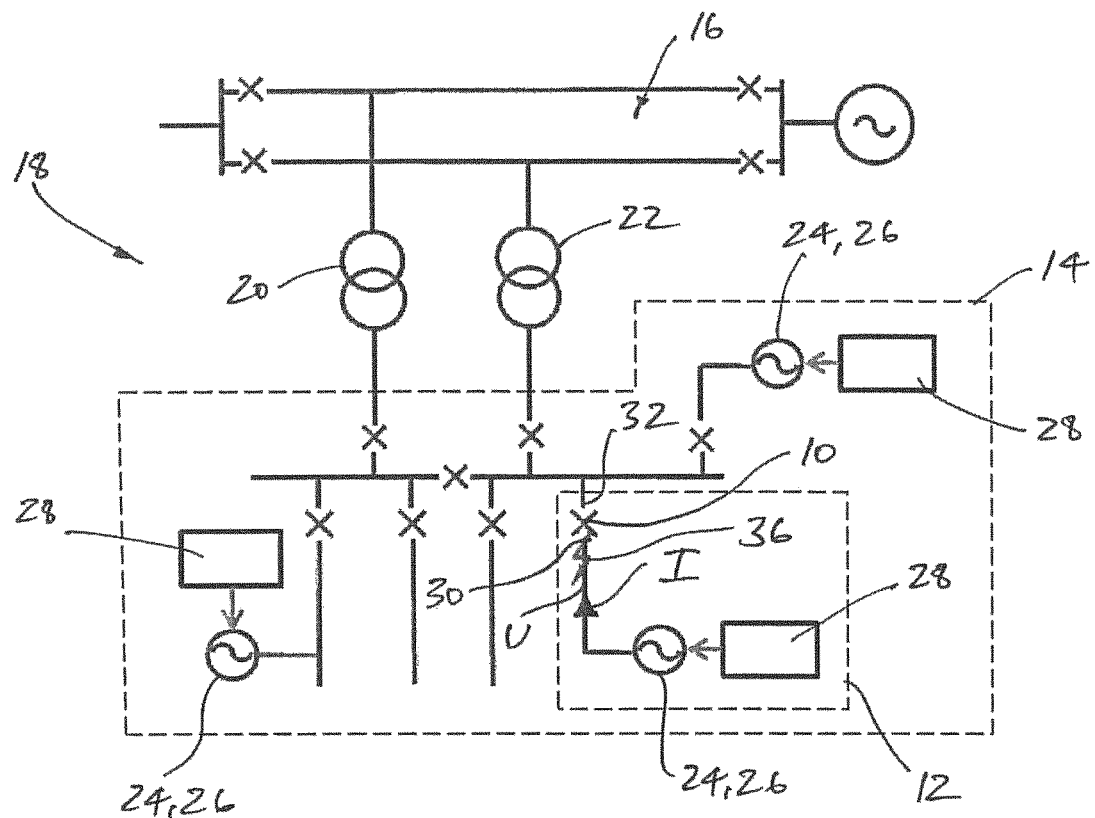
FIG. 1 shows a schematic view of an electrical network including a circuit interruption apparatus.

A circuit interruption apparatus according to an embodiment of the invention is, as shown schematically in FIG. 1, designated by reference numeral 10.

The circuit interruption apparatus 10 lies in a network branch 12 which forms a part of an active distribution network 14. The active distribution network 14 is connected to a sub-transmission network 16 of a wider electrical network 18 via first and second step-up transformers 20, 22. The transformers 20, 22 are able to operate either in parallel or separately to one another.

The active distribution network 14 includes a plurality of distributed voltage sources 24 in the form of distributed generators 26 (only some of which are shown in FIG. 1). Other forms of distributed voltage sources are also possible however. In an embodiment, each distributed generator 26 is controlled by a corresponding automatic voltage regulator 28.

The circuit interruption apparatus 10 includes a circuit interruption device (not shown) which is connected in use at a source side 30 to a source of the active distribution network 12, i.e. to a respective distributed voltage source 24 in the form of a distributed generator 26. The circuit interruption device is also connected in use at a back side 32 to one or more loads (not shown) in the remainder of the electrical network 18, e.g. within the remainder of the active distribution network 14, within the sub-transmission network 16, or elsewhere in the wider electrical network 18.

The circuit interruption device in an embodiment takes the form of a circuit breaker which, when closed, permits current I to flow between the source side 30 and the back side 32 thereof and which, when open, inhibits current from flowing between the source side 30 and the back side 32 thereof. The circuit interruption device, i.e. the circuit breaker, is configured to open when the current I flowing therethrough meets or exceeds a fault current threshold, e.g. as may be provided by a protective relay in the form of a tripping signal.

The circuit interruption apparatus 10 also includes a current level determination unit (not shown) which is configured to determine a predicted fault current level, i.e. a fault current level which is expected to arise, given the instantaneous configuration and operating status of the remainder of the electrical network 18, if a fault 36 occurs close to the circuit interruption apparatus 10.

The current level determination unit is configured to determine such a predicted fault current level as a function of measured current I and voltage U values of the circuit interruption device which are taken before and after a variation in the current and voltage values at the circuit interruption device that result from a change of load at the back side 32 of the circuit interruption device, i.e. a change in one or more of the loads in the remaining electrical network 18.

More particularly the fault current level determination unit is configured to determine each of an equivalent voltage source value $E_{eq}$ of the electrical network at the back side 32 of the circuit interruption device, i.e. of the entire remaining electrical network 18, and an equivalent impedance value $Z_{eq}$ of the remaining electrical network 18 at the back side 32 of the circuit interruption device. The fault current level determination unit is so configured to determine each of the equivalent voltage source value $E_{eq}$ and the equivalent impedance value $Z_{eq}$ from the measured current I and voltage U values at the circuit interruption device.

Figure 2:
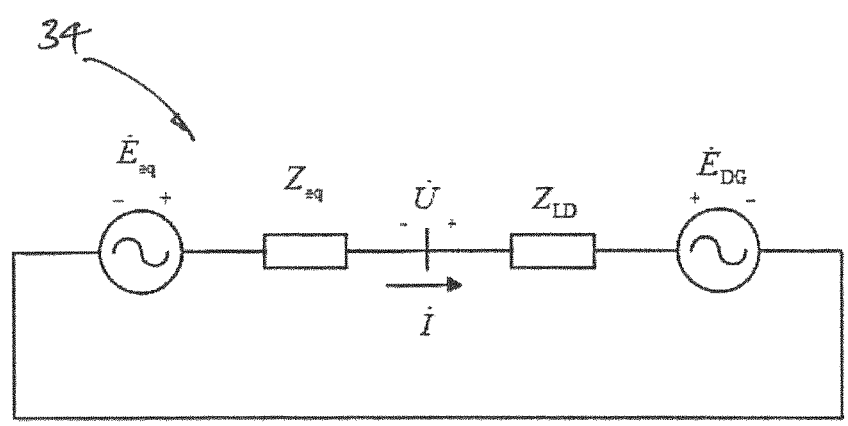
FIG. 2 shows an equivalent circuit for the electrical network shown in FIG. 1.

In this regard the remaining electrical network 18 on the back side 32 of the circuit interruption device, i.e. behind the circuit interruption device, and the network branch 12 on the source side 30 of the circuit interruption device can be represented by a Thevenin equivalent circuit 34, as shown in FIG. 2.

As well as the equivalent voltage source value $E_{eq}$ and the equivalent impedance value $Z_{eq}$ mentioned above, the equivalent circuit 34 also includes an equivalent voltage source value $E_{DG}$ of the network branch 12 (which would be zero if there was no distributed voltage source 24, i.e. distributed generator 26, in the network branch 12), and an equivalent impedance $Z_{LD}$ of the network branch 12.

The current I flowing through the circuit interruption device at any particular moment, as well as the voltage U that the circuit interruption device is exposed to, i.e. the voltage level of the network branch 12, are also indicated in phasor form in the equivalent circuit 34. These two current and voltage values I, U are the only electrical quantities available by measurement to the circuit interruption apparatus, i.e. to the fault current level determination unit therein.

The fault current level determination unit is configured to use the equivalent voltage source value $E_{eq}$ and the equivalent impedance value $Z_{eq}$ to determine the predicted fault current level according to:

$$I_{PFI} = E_{eq}/Z_{eq}$$

where $I_{PFI}$ is the predicted fault current level.

In the embodiment shown the fault current level determination unit determines the equivalent voltage source value $E_{eq}$ and the equivalent impedance value $Z_{eq}$ by first calculating a current phasor $\dot{I}$ from the measured current value I of the circuit interruption device and a voltage phasor $\dot{U}$ from the measured voltage value U of the circuit interruption device.

Figure 3:
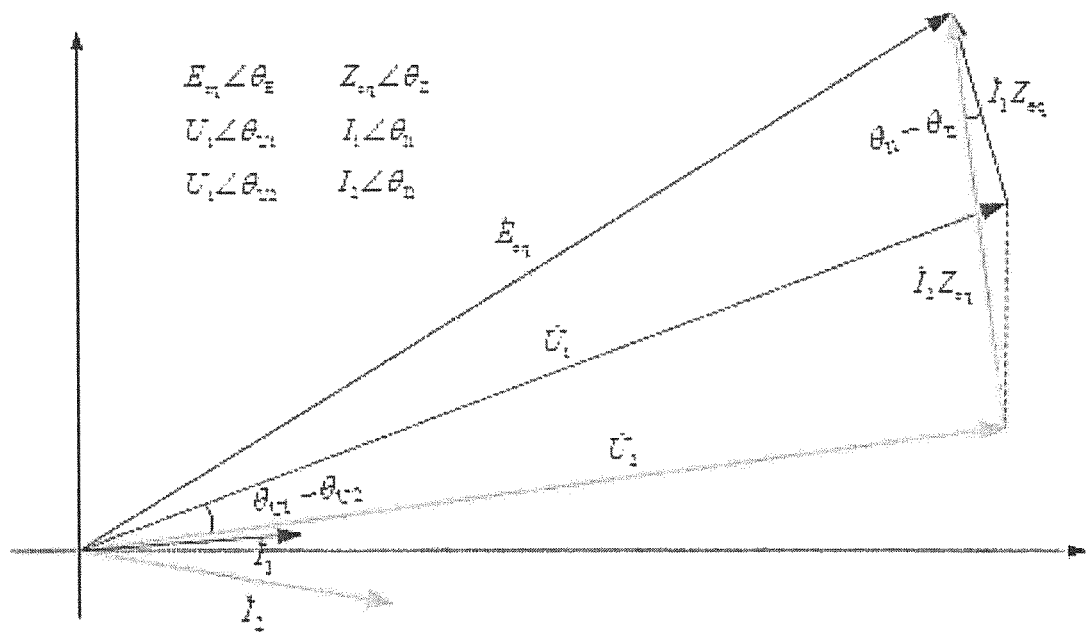
FIG. 3 shows a phasor diagram including first and second current phasors and first and second voltage phasors calculated during operation of the circuit interruption apparatus shown in FIG. 1.

More particularly, the fault current level determination unit is configured to measure first current and voltage values of the circuit interruption device at a first time and thereafter calculate first current and voltage phasors $\dot{I}_1$, $\dot{U}_1$, as illustrated in FIG. 3, and to measure second current and voltage values of the circuit interruption device at a second time after the first time and thereafter calculate second current and voltage phasors $\dot{I}_2$, $\dot{U}_2$, as also shown in FIG. 3.

In each instance, when the circuit interruption apparatus 10 is located in a three phase electrical network, the first current and voltage phasors $\dot{I}_1$, $\dot{U}_1$ and the second current and voltage phasors $\dot{I}_2$, $\dot{U}_2$ are calculated from a sample of each phase current and each phase voltage, respectively. During normal operation of such a three phase electrical network the three phases are symmetrical to one another, and so the current and voltage phasors $\dot{I}_1$, $\dot{U}_1$, $\dot{I}_2$, $\dot{U}_2$ calculated therefrom in the foregoing manner are suitably representative of the instantaneous configuration and operating status of the remainder of the electrical network 18.

One way in which the magnitude and angle of each of the current and voltage phasors $\dot{I}_1$, $\dot{U}_1$, $\dot{I}_2$, $\dot{U}_2$ be calculated from the measured current and voltage values is by a Full-Cycle Fourier Transform.

The relationship between the first current and voltage phasors $\dot{I}_1$, $\dot{U}_1$ and the second current and voltage phasors $\dot{I}_2$, $\dot{U}_2$, as depicted in FIG. 3, allows the equivalent impedance value $Z_{eq}$ to be determined according to:

$$Z_{eq} = \arg\frac{\dot{U}_1 - \dot{U}_2}{\dot{I}_1 - \dot{I}_2}$$

which, in turn, is derived from $$Z_{eq} = \sqrt{\frac{U_1^2 + U_2^2 - 2U_1U_2\cos(\theta_{U1} - \theta_{U2})}{I_1^2 + I_2^2 - 2I_1I_2\cos(\theta_{I1} - \theta_{I2})}}$$

where $I_1$ is the magnitude of the first current phasor; $I_2$ is the magnitude of the second current phasor; $U_1$ is the magnitude of the first voltage phasor; $U_2$ is the magnitude of the second voltage phasor; $\theta_{I1}$ is the angle of the first current phasor; $\theta_{I2}$ is the angle of the second current phasor; $\theta_{U1}$ is the angle of the first voltage phasor; and $\theta_{U2}$ is the angle of the second voltage phasor.

The aforementioned relationship between the first current and voltage phasors $\dot{I}_1$, $\dot{U}_1$ and the second current and voltage phasors $\dot{I}_2$, $\dot{U}_2$, also allows the equivalent voltage source value $E_{eq}$ to be determined according to:

$$E_{eq} = \sqrt{U_2^2 + (I_2 Z_{eq})^2 - 2U_2 I_2 Z_{eq}\cos(\theta_{U1} - \theta_{I1} + \theta_Z)}$$

where $\theta_Z$ is the angle of the determined equivalent impedance value.

After calculating the current and voltage phasors $\dot{I}_1$, $\dot{U}_1$, $\dot{I}_2$, $\dot{U}_2$, but prior to determining each of the equivalent voltage source value $E_{eq}$ and the equivalent impedance value $Z_{eq}$, the fault current level determination unit is additionally configured to assess the nature of any variation in the measured current value I at the circuit interruption device.

Firstly the fault current level determination unit is configured to assess the nature of any variation in the measured current value at the circuit interruption device by detecting whether a predetermined degree of current variation takes place.

In the embodiment shown the fault current level determination unit detects whether a predetermined degree of current variation has taken place by considering whether $$\Delta i(k) > \varepsilon_1$$

where $\Delta i(k)$ is the change in the measured current value, which is given by:

$$\Delta i(k) = \||i(k) - i(k-N)| - |i(k-N) - i(k-2N)|\|$$

where $i(k)$ is the most recent measured current value; $i(k-N)$ is the measured current value one cycle before; $i(k-2N)$ is the measured current value two cycles before; and N is the number of samples per cycle; and where $\varepsilon_1$ is a first predetermined threshold which by way of example may be 0.05 p.u. (per unit of current).

In an embodiment, the fault current level determination unit checks whether the change in the measured current value $\Delta i(k)$ meets the required criterion, i.e. is greater than the first predetermined threshold $\varepsilon_1$, three times. In embodiments of the invention, however, it may check fewer than or more than three times. In addition, in embodiments of the invention the fault current level determination unit may use different steps to detect whether a predetermined degree of current variation has taken place.

In any event when the required criterion is met, i.e. the fault current level determination unit determines that a desired degree of current variation has taken place (i.e. so as to reduce the likelihood of an erroneous predicted fault current value $I_{PFI}$ being determined), the fault current level determination unit is further configured to assess the nature of any variation in the measured current value at the circuit interruption device in a second manner.

The second manner requires the fault current level determination unit to identify whether the current variation takes place on the back side 32 of the circuit interruption device.

The fault current level determination achieves this by checking whether $$\text{real}\left(\frac{\Delta \dot{U} \Delta \hat{I}}{\|\Delta \dot{U} \Delta \hat{I}\|}\right) < \varepsilon_2$$

where $\Delta \dot{U} = \dot{U}(k) - \dot{U}(k')$; $\Delta \dot{I} = \dot{I}(k) - \dot{I}(k')$; $\Delta \hat{I}$ is the conjugate of $\Delta \dot{I}$ k is the most recent sample; k' is the sample stored before the most recent current variation; the difference between k and k' is an integer multiple of N; $\varepsilon_2$ is a second predetermined threshold; and $\|\ \|$ is the operator of norm or RMS value.

The second predetermined threshold $\varepsilon_2$ may be zero in some embodiments. It may also express, in the form of a ratio (i.e. a value between −1 and +1), the minimum value that the circuit interruption device can identify, i.e. measure, and so may take the value −0.05.

In an embodiment, the fault current level determination unit checks whether it identifies the current variation to have taken place on the back side 32 of the circuit interruption device on three separate occasions, before confirming that the current variation did take place on the back side 32 of the circuit interruption device. In embodiments of the invention, however, the current level determination unit may check fewer than or more than three times. In addition, in embodiments of the invention the fault current level determination unit may use different steps to identify that the current variation has taken place on the back side 32 of the circuit interruption device.

In any event when the required criterion is met, i.e. the fault current level determination unit confirms that the current variation did take place on the back side 32 of the circuit interruption device, the fault current level determination unit proceeds to determine the equivalent voltage source value $E_{eq}$ and the equivalent impedance value $Z_{eq}$ in the manner set out hereinabove.

After determining each of the equivalent voltage source value $E_{eq}$ and the equivalent impedance value $Z_{eq}$, the fault current level determination unit is additionally configured to filter each of the determined equivalent voltage source value $E_{eq}$ and the equivalent impedance value $Z_{eq}$.

More particularly, the fault current level determination unit is configured to filter each of the determined equivalent voltage source value $E_{eq}$ and the determined equivalent impedance value $Z_{eq}$ by calculating an average of each of the determined equivalent voltage source value $E_{eq}$ and the determined equivalent impedance value $Z_{eq}$ over a predetermined number of iterations.

The fault current level determination unit may calculate such an average according to:

$$Z'_{eq}(k) = \frac{1}{k}(Z'_{eq}(k-1) * (k-1) + Z_{eq}(k));$$

and $$E'_{eq}(k) = \frac{1}{k}(E'_{eq}(k-1) * (k-1) + E_{eq}(k))$$

Once the first determined equivalent voltage source and impedance values $E_{eq}$, $Z_{eq}$ have been determined the fault current level determination starts the aforementioned average filter. For each new sample period, the new calculated equivalent voltage source and impedance values $E'_{eq}$, $Z'_{eq}$ are added to the average calculation result.

The predetermined number of iterations over which average equivalent voltage source and impedance values $E_{eq}$, $Z_{eq}$ are calculated is in an embodiment equivalent to two cycles of fundamental frequency, for example, 48 iterations or samples for a sampling rate of 24 samples per cycle.

In the embodiment shown, the fault current level determination unit is also configured to filter each of the determined equivalent voltage source value $E_{eq}$ and the determined equivalent impedance value $Z_{eq}$ by comparing the fluctuation in each of the determined equivalent voltage source value $E_{eq}$ and the determined equivalent impedance value $Z_{eq}$ with a corresponding third or fourth predetermined threshold $\varepsilon_3$, $\varepsilon_4$, i.e. according to:

$$|Z'_{eq}(k) - Z'_{eq}(k-1)|/|Z'_{eq}(k)| < \varepsilon_3;$$

and $$|E'_{eq}(k) - E'_{eq}(k-1)|/|E'_{eq}(k)| < \varepsilon_4$$

In an embodiment, the third predetermined threshold $\varepsilon_3$ lies between 0.001 and 0.01, while the fourth predetermined threshold $\varepsilon_4$ also lies between 0.001 and 0.01.

When the fluctuation in either the determined equivalent voltage source value $E_{eq}$ or the determined equivalent impedance value $Z_{eq}$ is greater than or equal to the corresponding third or fourth predetermined threshold $\varepsilon_3$, $\varepsilon_4$ the fault current level determination unit discards the corresponding determined equivalent voltage source value $E_{eq}$ or corresponding determined equivalent impedance value $Z_{eq}$.

More particularly, the fault current level determination unit checks whether the fluctuation in each of the determined equivalent voltage source value $E_{eq}$ and the determined equivalent impedance value $Z_{eq}$ is below the corresponding threshold $\varepsilon_3$, $\varepsilon_4$ on three separate occasions before confirming the stability of the said determined equivalent voltage source and impedance values $E_{eq}$, $Z_{eq}$.

In embodiments of the invention the current level determination unit may check fewer than or more than three times. In addition, in embodiments of the invention the fault current level determination unit may use different steps to compare the fluctuation in the determined equivalent voltage source and impedance values $E_{eq}$, $Z_{eq}$.

In any event, when the stability of the determined equivalent voltage source and impedance values $E_{eq}$, $Z_{eq}$ is confirmed the fault current level determination unit proceeds to determine the predicted fault current level $I_{PFI}$ using $$I_{PFI} = E_{eq}/Z_{eq}$$

Following such determination of the predicted fault current level $I_{PFI}$, the fault current level determination unit is configured to then compare the determined predicted fault current level $I_{PFI}$ with each of first and second setting thresholds and to issue an alarm depending on the outcome of each comparison.

More particularly, the fault current level determination unit compares the determined predicted fault current level $I_{PFI}$ with a first setting threshold which corresponds to the rated opening capacity of the circuit interruption device. The fault current level determination unit issues an alarm, e.g. an audible and/or visible alarm, if the determined predicted fault current level $I_{PFI}$ is greater than the first setting threshold, i.e. greater than the rated opening capacity of the circuit interruption device, such that the circuit interruption device would not be able to handle the actual fault current level should it arise.

The fault current level determination unit also compares the determined predicted fault current level $I_{PFI}$ with a second setting threshold that corresponds to a minimum fault current feeding capacity of the remainder of the electrical network 18 in which the circuit interruption device is located, and is thereby indicative of the back side of the circuit interruption device becoming disconnected from the said remainder of the electrical network 18.

The fault current level determination unit issues an alarm, e.g. an audible and/or visible alarm, if the determined predicted fault current level $I_{PFI}$ is less than the second setting threshold, i.e. if the predicted fault current level is indicative of the back side of the circuit interruption device having become disconnected from the remainder of the electrical network 18.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A circuit interruption apparatus, for an electrical network, comprising:
   a circuit interruption device operatively connectable at a source side to a source of the electrical network and at a back side to a load of an electrical network, the circuit interruption device when closed permitting current to flow between the source side and the back side, and the circuit interruption device when open inhibiting current from flowing between the source side and the back side, wherein the circuit interruption device is configured to open when a current flowing therethrough meets or exceeds a fault current threshold; and
   a fault current level determination unit configured to determine a predicted fault current level as a function of measured current and voltage values at the circuit interruption device before and after a variation in the current and voltage values at the circuit interruption device resulting from a change of load at the back side of the circuit interruption device.

2. The circuit interruption apparatus according to claim 1 wherein the fault current level determination unit is configured to determine each of an equivalent voltage source value of an electrical network on the back side of the circuit interruption device and an equivalent impedance value of the electrical network on the back side of the circuit interruption device from the measured current and voltage values at the circuit interruption device, and to use the equivalent voltage source value and the equivalent impedance value to determine the predicted fault current level.

3. The circuit interruption apparatus according to claim 2 wherein the fault current level determination unit is configured to calculate a current phasor from the measured current value at the circuit interruption device and a voltage phasor from the measured voltage value at the circuit interruption device, and to use the calculated current and voltage phasors to determine the equivalent voltage source value and the equivalent impedance value.

4. The circuit interruption apparatus according to claim 3 wherein the fault current level determination unit is configured to:
measure first current and voltage values at the circuit interruption device at a first time and thereafter calculate first current and voltage phasors;
measure second current and voltage values at the circuit interruption device at a second time after the first time and thereafter calculate second current and voltage phasors; determine the equivalent impedance value according to:
wherein:

$$Z_{eq} = \arg \frac{\dot{U}_1 - \dot{U}_2}{\dot{I}_1 - \dot{I}_2}$$

$Z_{eq}$ is the determined equivalent impedance value;
$U_1$ is the first voltage phasor;
$U_2$ is the second voltage phasor;
$I_1$ is the first current phasor; and
$I_2$ is the second current phasor and determine the equivalent voltage source value according to:

$$E_{eq} = \sqrt{U_2^2 + (I_2 Z_{eq})^2 - 2U_2 I_2 Z_{eq} \cos(\theta_{U1} - \theta_{I1} + \theta_Z)}$$

wherein:
$E_{eq}$ is the determined equivalent voltage source value;
$U_2$ is the magnitude of the second voltage phasor;
$I_2$ is the magnitude of the second current phasor;
$\theta_{U1}$ is the angle of the first voltage phasor;
$\theta_{I1}$ is the angle of the first current phasor; and
$\theta_z$ the angle of the determined equivalent impedance value.

5. The circuit interruption apparatus according to claim 2 wherein prior to determining each of an equivalent voltage source value and an equivalent impedance value the fault current level determination unit is additionally configured to assess the nature of any variation in the measured current value at the circuit interruption device.

6. The circuit interruption apparatus according to claim 5 wherein the fault current level determination unit is configured to assess the nature of any variation in the measured current value of the circuit interruption device by detecting whether a predetermined degree of current variation takes place.

7. The circuit interruption apparatus according to claim 5 wherein the fault current level determination unit is configured to assess the nature of any variation in the measured current value at the circuit interruption device by identifying whether the current variation takes place on the back side of the circuit interruption device.

8. The circuit interruption apparatus according to claim 2 wherein after determining each of an equivalent voltage source value and an equivalent impedance value the fault current level determination unit is additionally configured to filter each of the determined equivalent voltage source value and the determined equivalent impedance value.

9. The circuit interruption apparatus according to claim 8 wherein the fault current level determination unit is configured to filter each of the determined equivalent voltage source value and the determined equivalent impedance value by calculating an average of each of the determined equivalent voltage source value and the determined equivalent impedance value over a predetermined number of iterations.

10. The circuit interruption apparatus according to claim 8 wherein the fault current level determination unit is configured to filter each of the determined equivalent voltage source value and the determined equivalent impedance value by comparing the fluctuation in each of the determined equivalent voltage source value and the determined equivalent impedance value with a predetermined threshold and discarding the or each of the corresponding determined equivalent voltage source value and the corresponding determined equivalent impedance value when the fluctuation is greater than the predetermined threshold.

11. The circuit interruption apparatus according to claim 1 wherein the fault current level determination unit is further configured to compare the determined predicted fault current level with at least one setting threshold and to issue an alarm depending on the outcome of the comparison.

* * * * *